(12) United States Patent
Xue et al.

(10) Patent No.: US 10,598,743 B2
(45) Date of Patent: Mar. 24, 2020

(54) MAGNETORESISTIVE MAGNETIC IMAGING SENSOR

(71) Applicant: MultiDimension Technology Co., Ltd., Zhangjiagang (CN)

(72) Inventors: Songsheng Xue, Zhangjiagang (CN); Xiaofeng Lei, Zhangjiagang (CN); Xiaojun Zhang, Zhangjiagang (CN)

(73) Assignee: MULTIDIMENSION TECHNOLOGY CO., LTD, Zhangjiagang, Jiangsu (CN)

( * ) Notice: Subject to any disclaimer, the term of this patent is extended or adjusted under 35 U.S.C. 154(b) by 600 days.

(21) Appl. No.: 15/128,821

(22) PCT Filed: Mar. 24, 2015

(86) PCT No.: PCT/CN2015/074982
§ 371 (c)(1),
(2) Date: Sep. 23, 2016

(87) PCT Pub. No.: WO2015/144046
PCT Pub. Date: Oct. 1, 2015

(65) Prior Publication Data
US 2017/0371005 A1 Dec. 28, 2017

(30) Foreign Application Priority Data
Mar. 25, 2014 (CN) .......................... 2014 1 0113778

(51) Int. Cl.
*G01R 33/09* (2006.01)
*G07D 7/04* (2016.01)
*G01R 33/00* (2006.01)

(52) U.S. Cl.
CPC ......... *G01R 33/09* (2013.01); *G01R 33/0005* (2013.01); *G07D 7/04* (2013.01)

(58) Field of Classification Search
CPC ....... G01R 33/09; G01R 33/0005; G07D 7/04
(Continued)

(56) References Cited

U.S. PATENT DOCUMENTS

| 2006/0125176 A1* | 6/2006 | Kato | G07D 7/04 |
| | | | 271/258.01 |
| 2007/0000750 A1* | 1/2007 | Uno | G07D 7/04 |
| | | | 194/207 |

(Continued)

FOREIGN PATENT DOCUMENTS

| CN | 1790424 A | 6/2006 |
| CN | 1881258 A | 12/2006 |

(Continued)

OTHER PUBLICATIONS

"International Application No. PCT/CN2015/074982, International Search Report and Written Opinion dated Jun. 17, 2015", (dated Jun. 17, 2015), 14 pgs.

*Primary Examiner* — Melissa J Koval
*Assistant Examiner* — Courtney G McDonnough
(74) *Attorney, Agent, or Firm* — Schwegman Lundberg & Woessner, P.A.

(57) ABSTRACT

A magnetoresistive magnetic imaging sensor for identifying a magnetic image comprises a PCB and several magnetoresistive sensor chips, wherein the several magnetoresistive sensor chips are located on the PCB, and the PCB is perpendicular or parallel to the magnetic image detection surface. It has a lateral detection mode and front detection mode. In the lateral detection mode, each side face of the several magnetoresistive sensor chips is parallel or coplanar with the side of the PCB, and parallel to the magnetic image detection surface. The several magnetoresistive sensor chips have the same magnetic sensing direction. In the lateral detection mode, the adjacent magnetoresistive sensor chips are stacked, while in the front detection mode, the adjacent (Continued)

magnetoresistive sensor chips are arranged in a staggered manner, in order to achieve continuity of the detection area in the magnetic image detection surface. The magnetoresistive magnetic imaging sensor may also comprise a permanent magnet assembly and a housing. The sensor has several advantages, including continuity across the detection area, good signal reproduction, high sensitivity, and low power consumption.

9 Claims, 8 Drawing Sheets

(58) Field of Classification Search
USPC .......................................................... 324/252
See application file for complete search history.

(56) References Cited

U.S. PATENT DOCUMENTS

| | | | | |
|---|---|---|---|---|
| 2008/0116885 | A1* | 5/2008 | Van Zon | G01L 5/223 324/207.21 |
| 2013/0119980 | A1* | 5/2013 | Ogomi | G01R 33/091 324/252 |
| 2013/0127457 | A1* | 5/2013 | Musha | B82Y 25/00 324/252 |
| 2015/0294521 | A1* | 10/2015 | Deak | G01R 33/09 324/252 |
| 2016/0084923 | A1* | 3/2016 | Bai | G07D 7/04 324/252 |

FOREIGN PATENT DOCUMENTS

| | | |
|---|---|---|
| CN | 201725379 | 1/2011 |
| CN | 102194273 A | 9/2011 |
| CN | 202916902 U | 5/2013 |
| CN | 103226865 | 7/2013 |
| CN | 203038357 U | 7/2013 |
| CN | 203217645 | 9/2013 |
| CN | 103632431 | 3/2014 |
| CN | 103927811 | 7/2014 |
| CN | 203812310 | 9/2014 |
| JP | 2005249468 | 9/2005 |
| WO | WO-2015144046 | 10/2015 |

\* cited by examiner

FIG. 23

MAGNETORESISTIVE MAGNETIC IMAGING SENSOR

PRIORITY CLAIM TO RELATED APPLICATIONS

This application is a U.S. national stage application filed under 35 U.S.C. § 371 from International Application Serial No. PCT/CN2015/074982, which was filed 24 Mar. 2015, and published as WO2015/144046 on 1 Oct. 2015, and which claims priority to Chinese Application No. 201410113778.3, filed 25 Mar. 2014, which applications and publication are incorporated by reference as if reproduced herein and made a part hereof in their entirety, and the benefit of priority of each of which is claimed herein.

TECHNICAL FIELD

The present invention relates to the field of magnetic sensors, and in particular, to a magnetoresistive magnetic imaging sensor for identifying a magnetic image.

BACKGROUND ART

A magnetic image identification sensor is mainly used in the field of finance, for example, in a POS, an ATM, a currency detector, a money counting machine and so on. A magnetic strip of a credit card is made of a hard magnetic material, a magnetic field thereof can be measured directly, a surface image of a banknote is printed by ink containing soft magnetic particles, and the magnetic particles are magnetized, upon application of a bias magnetic field, to be detected by the magnetic image identification sensor, achieving identification of information of the credit card or the image of the banknote. The magnetic image identification sensor generally adopts an audio magnetic head technology or a magnetoresistive head technology. The audio magnetic head uses a coil to wind a ring-like structure with a gap, which uses the principle of electromagnetic induction. A magnetic flux change occurs when the gap rapidly passes through the magnetic particles, and thus an induction current is induced in the coil and distribution signals of magnetic images are established according to changes to the current. Main problems existing in the technology are as follows: 1. the magnetic field sensitivity is low, and only with a method of increasing the number of turns can an effective signal be obtained; 2. the size is large, the size resolution is low, rapid movement is required, and there is no response to static magnetic field signals; and 3. the power consumption is large. The magnetoresistive head, for example, a Hall effect sensor, mainly has the following problems: 1) the Hall effect sensor has low magnetic field sensitivity, and therefore, for magnetic particle detection, a large enough bias magnetic field is required to generate sufficient magnetization intensity so as to be detected by a magnetic sensor, and thus the volume of a financial magnetic head is increased; and 2) the Hall effect sensor has low magnetic field sensitivity, generates low magnetic field output signals, and also has high power consumption. In addition, whether the audio magnetic head technology or the magnetoresistive head technology is adopted, when several magnetic sensors are employed to implement detection on large-scale magnetic images, a form of arranging the magnetic sensors into rows and columns is generally used; as a result, there are undetected areas between adjacent magnetic sensors, and undetected areas are present in the resultant image identification.

SUMMARY OF THE INVENTION

In order to solve the above existing problems, a magnetoresistive magnetic imaging sensor for identifying a magnetic image is provided in the present invention, which uses a magnetoresistive sensor, for example, a TMR magnetic sensor, to implement detection on magnetic nano-particle images of banknotes; TMR sensors have characteristics of high magnetic field sensitivity, small size and low power consumption, and chips can be arranged in a staggered or stacked manner, so as to overcome the above problems.

A magnetoresistive magnetic imaging sensor for identifying a magnetic image provided in the present invention is used for detecting a magnetic image, the plane where the magnetic image is located being a magnetic image detection surface, the sensor including a lateral/front detection mode image identification sensor; the lateral/front detection mode image identification sensor includes several magnetoresistive sensor chips on a PCB, respectively; each side face of the several magnetoresistive sensor chips of the lateral detection mode image identification sensor is parallel to the magnetic image detection surface; front surfaces of the several magnetoresistive sensor chips of the front detection mode image identification sensor are parallel to the magnetic image detection surface; and the adjacent magnetoresistive sensor chips are complementary to or intersect with each other in scanning detection areas along a scanning direction on the magnetic image detection surface.

The adjacent magnetoresistive sensor chips corresponding to the front detection mode image identification sensor are arranged, in a mutually staggered manner, along edges of the magnetoresistive sensor chips in the front surface of the PCB.

One side of each of the several magnetoresistive sensor chips on the PCB corresponding to the lateral detection mode image identification sensor is cocked away from the front surface of the PCB, and the other side is obliquely stacked with one side of each of the adjacent magnetoresistive sensor chips.

The adjacent magnetoresistive sensor chips in the several magnetoresistive sensor chips on the PCB corresponding to the lateral detection mode image identification sensor are on-chip staggered and stacked.

A permanent magnet assembly is included; magnetic sensing directions of the several magnetoresistive sensor chips of the front detection mode image identification sensor are parallel to the scanning direction, while magnetic sensing directions of the several magnetoresistive sensor chips of the lateral detection mode image identification sensor are perpendicular to the magnetic image detection surface.

The permanent magnet assembly includes two permanent magnets having the same magnetization direction which are symmetrically located on two sides of the PCB along the scanning direction respectively, and the magnetization direction is perpendicular to the front surface of the PCB.

For the lateral detection mode image identification sensor, the permanent magnet assembly includes two permanent magnets symmetrically placed on two sides of the front surface of the PCB, magnetization directions thereof are both perpendicular to the magnetic image detection surface, but the magnetization directions of the two permanent magnets are opposite.

For the lateral detection mode image identification sensor, the permanent magnet assembly includes a permanent magnet and a soft magnet located on two sides of the front surface of the PCB respectively, the magnetization direction of the permanent magnet is perpendicular to the direction of the front surface of the PCB, and the soft magnet is parallel to the front surface of the PCB.

For the lateral detection mode image identification sensor, the permanent magnet assembly includes a structure having an opening towards the magnetic image detection surface and formed by a permanent magnet and an L-shaped soft magnet, which are located on the same side of the PCB, and the L-shaped soft magnet is located between the permanent magnet and the PCB. The permanent magnet is located on the bottom of the L-shaped soft magnet and the magnetization direction thereof is perpendicular to the magnetic image detection surface, and a side face of the L-shaped soft magnet is parallel to the PCB.

For the lateral detection mode image identification sensor, the permanent magnet assembly includes a structure having an opening towards the magnetic image detection surface and formed by a permanent magnet and two soft magnets, wherein the magnetization direction of the permanent magnet is perpendicular to the front surface of the PCB, the permanent magnet is located at the bottom of the PCB, and the two soft magnets are symmetrically located on two sides of the front surface of the PCB and two ends of the permanent magnet, and are parallel to the PCB.

For the front detection mode image identification sensor, the permanent magnet assembly is a concave permanent magnet, wherein a surface of the concave permanent magnet provided with a groove directly faces the back surface of the PCB, the grooving direction is parallel to the magnetic image detection surface and perpendicular to the magnetic sensing directions, and the magnetization direction of the concave permanent magnet is perpendicular to the direction of the PCB.

For the front detection mode image identification sensor, the permanent magnet assembly includes a back permanent magnet on the back surface of the PCB and two side permanent magnets symmetrically placed on two sides of the PCB along the scanning direction, wherein magnetization directions of the back permanent magnet and the two side permanent magnets are all perpendicular to the magnetic image detection surface, and the magnetization directions of the back permanent magnet and the two side permanent magnets are opposite.

Magnetic sensing directions of the several magnetoresistive sensor chips of the front detection mode image identification sensor are parallel to or perpendicular to the direction of the magnetic image detection surface, and when the magnetic sensing directions of the several magnetoresistive sensor chips are parallel to the magnetic image detection surface, the magnetic sensing directions are parallel to or perpendicular to the scanning direction.

The magnetoresistive sensor chips are a half-bridge structure including two, three or four magnetic sensing units arranged into two rows and one column, three rows and one column, or two rows and two columns respectively, and magnetic sensing directions of the various magnetic sensing units are identical; when the magnetoresistive magnetic sensor chips include two magnetic sensing units, the two magnetic sensing units have the same resistance and directly form a half bridge; when the magnetoresistive magnetic sensor chips include three magnetic sensing units, the resistance of the sensing unit in the middle row is half of the resistances of the two sensing units on two side rows, and the two sensing units on the two side rows, after being connected in parallel, form a half-bridge structure with the sensing unit in the middle row; when the magnetoresistive magnetic sensor chips include four magnetic sensing units, resistances of the four sensing units are the same, and two magnetic sensing units in the same row are connected in parallel and then the two rows are connected in series to form a half-bridge structure; in the lateral detection mode image identification sensor, the column direction thereof is perpendicular to the magnetic image detection surface, and during packaging, the magnetic sensing units are located on one side of the chips close to the magnetic image detection surface; and in the front detection mode image identification sensor, the column direction thereof is parallel to the scanning direction.

The magnetoresistive sensor chips are a full-bridge structure including four magnetic sensing units, and magnetic sensing directions of the various magnetic sensing units are identical, the four magnetic sensing units are arranged into two rows and two columns, two sensing units included in two half bridges forming a full bridge are located in two rows but in different columns respectively; in the lateral detection mode image identification sensor, the column direction thereof is perpendicular to the magnetic image detection surface, and during packaging, the sensing units are located on one side of the chips close to the magnetic image detection surface, and in the front detection mode image identification sensor, the column direction thereof is parallel to the scanning direction.

The magnetoresistive sensor chips of the half-bridge structure are a single magnetoresistive sensor chip integrated with several sensing units, or an interconnected combination of discrete elements of several magnetoresistive sensor chips integrated with one or more sensing units.

The magnetoresistive sensor chips of the full-bridge structure are a single magnetoresistive sensor chip integrated with several sensing units, or an interconnected combination of discrete elements of several magnetoresistive sensor chips integrated with one or more sensing units.

The magnetoresistive sensor chips are of a packaging structure adopting a front bonding pad or a TSV via a back bonding pad of the magnetoresistive sensor chips for wire-bonding.

A housing may be further included, in which the PCB and the several magnetoresistive sensor chips are placed; the permanent magnet assembly is partially or wholly placed in the housing, or wholly located outside the housing.

The magnetic sensing units in the magnetoresistive magnetic sensor chips are one of AMR, Hall, GMR or TMR type magnetoresistive sensor.

Each side face of the magnetoresistive sensor chips corresponding to the lateral detection mode image identification sensor is coplanar with a side face of the PCB or parallel to the magnetic image detection surface.

DETAILED DESCRIPTION OF THE PREFERRED EMBODIMENTS

The present invention is described below in detail with reference to the drawings and embodiments.

Embodiment 1

Figure 1:
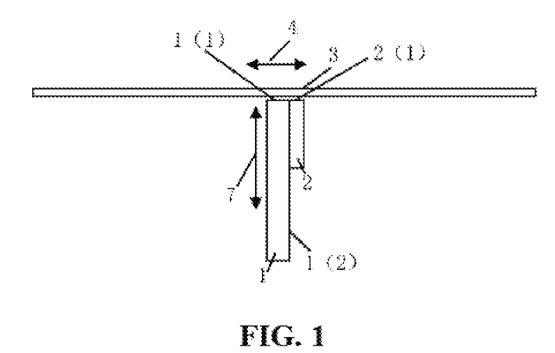
FIG. 1 is a diagram of a lateral detection mode image identification sensor.

FIG. 1 is a structural diagram of a lateral detection mode image identification sensor, including a PCB 1 and several magnetoresistive sensor chips 2. A surface having a greater area on the PCB 1 is its front surface 1(2), while a surface adjacent to the front surface 1(2) is its side face 1(1), and the direction of the front surface 1(2) of the PCB 1 is generally referred to as the direction of the PCB 1. Similarly, the magnetoresistive sensor chips 2 also have their front surfaces and side faces 2(1). The several magnetoresistive sensor chips 2 are located on the front surface 1(2) of the PCB 1, and the front surface 1(2) of the PCB 1, where the magnetoresistive sensor chips 2 are located, is perpendicular to a magnetic image detection surface 3. The magnetic image detection surface 3 is a plane where an image to be scanned and detected is located. Each side face 2(1) of the several magnetoresistive sensor chips 2 may be or not be coplanar with the side face 1(1) of the PCB 1 close to the magnetic image detection surface 3 but is parallel to and close to the magnetic image detection surface 3 as much as possible, magnetic sensing directions 7 of the several magnetoresistive sensor chips 2 are perpendicular to the magnetic image detection surface 3, and 4 in FIG. 1 is a scanning direction. The lateral detection mode magnetoresistive image identification sensor of the structure may be directly used for reading magnetic images made of permanent magnet materials, for example, it may be used in a magnetic head in a POS machine to read a permanent magnet strip on a credit card.

Embodiment 2

FIGS. 2-6 are schematic structural diagrams when a lateral detection mode image identification sensor is applied to reading magnetic images formed by soft magnetic materials, and further includes a permanent magnet assembly 5 and a housing 6. The housing 6 covers the outside of the PCB 1 and the several magnetoresistive magnetic sensor chips 2, and the permanent magnet assembly 5 may be wholly located in the housing 6 and may also be partially located in the housing 6 or wholly located outside the housing 6; for ease of description, FIGS. 2-6 only present the situation where the permanent magnet assembly 5 is wholly located in the housing 6. The function of the permanent magnet assembly 5 is to generate a magnetic field to magnetize soft magnetic materials in a magnetic image detection surface 3 made of the soft magnetic materials, to enable the soft magnetic materials to be detected by the several magnetoresistive magnetic sensor chips 2. The function of the housing 6 is to protect the magnetoresistive sensor chips 2 and the PCB 1. That the permanent magnet assembly 5 is wholly or partially located outside the housing 6 can reduce the volume of the image identification sensor.

Figure 2:
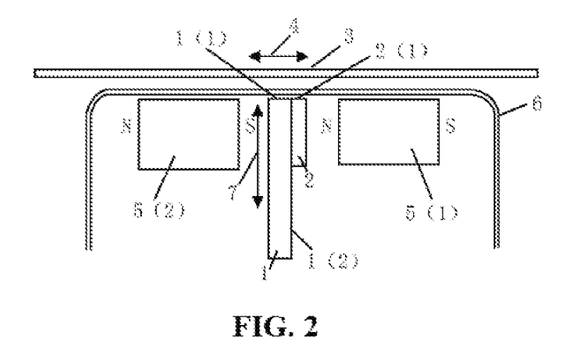
FIG. 2 is a schematic diagram of a first permanent magnet assembly used in the lateral detection mode image identification sensor.

The permanent magnet assembly 5 in the lateral detection mode image identification sensor shown in FIG. 2 includes two permanent magnets 5(1) and 5(2) which are symmetrically located at two sides of the front surface 1(2) of the PCB 1 and have the same magnetization direction, wherein the magnetization direction is perpendicular to the front surface 1(2) of the PCB 1.

Figure 3:
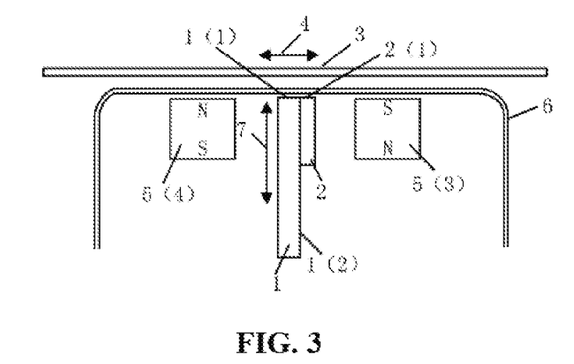
FIG. 3 is a schematic diagram of a second permanent magnet assembly used in the lateral detection mode image identification sensor.

The permanent magnet assembly 5 in the lateral detection mode image identification sensor shown in FIG. 3 includes two permanent magnets 5(3) and 5(4) which are symmetrically located at two sides of the front surface 1(2) of the PCB 1 and have anti-parallel magnetization directions, wherein their magnetization directions are parallel to magnetic sensing directions 7 of the several magnetoresistive sensor chips 2, that is, perpendicular to the magnetic image detection surface 3.

Figure 4:
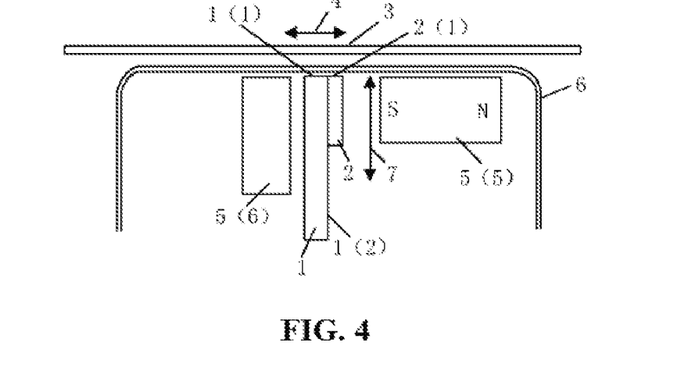
FIG. 4 is a schematic diagram of a third permanent magnet assembly used in the lateral detection mode image identification sensor.

The permanent magnet assembly 5 in the lateral detection mode image identification sensor shown in FIG. 4 includes a permanent magnet 5(5) and a soft magnet 5(6) which are located at two sides of the PCB 1 respectively, wherein the magnetization direction of the permanent magnet 5(5) is perpendicular to the front surface 1(2) of the PCB 1, while the soft magnet 5(6) is parallel to the front surface 1(2) of the PCB 1.

Figure 5:
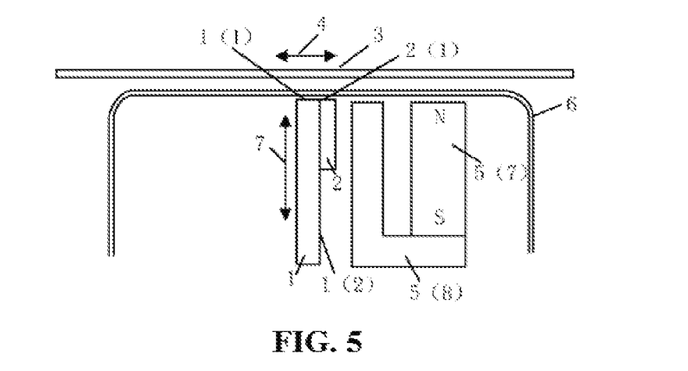
FIG. 5 is a schematic diagram of a fourth permanent magnet assembly used in the lateral detection mode image identification sensor.

The permanent magnet assembly 5 in the lateral detection mode image identification sensor shown in FIG. 5 includes a permanent magnet 5(7) and an L-shaped soft magnet 5(8). The permanent magnet 5(7) and the L-shaped soft magnet 5(8) are located at the same side of the PCB 1, and a gap facing the magnetic image detection surface 3 is formed between the permanent magnet 5(7) and the L-shaped soft magnet 5(8). The L-shaped soft magnet 5(8) is located at one side close to the PCB 1, and has a side portion and a bottom portion perpendicular to each other. The side portion of the L-shaped soft magnet 5(8) is parallel to the permanent magnet 5(7), and the bottom portion of the L-shaped soft magnet 5(8) is perpendicular to the front surface 1(2) of the PCB 1. The magnetization direction of the permanent magnet 5(7) is parallel to the magnetic sensing direction 7, and the permanent magnet 5(7) is located on the bottom portion of the L-shaped soft magnet 5(8) so as to form the gap facing the magnetic image detection surface 3.

Figure 6:
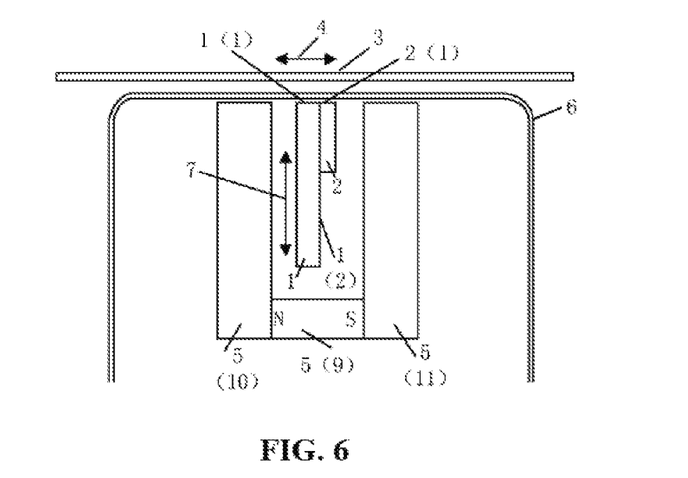
FIG. 6 is a schematic diagram of a fifth permanent magnet assembly used in the lateral detection mode image identification sensor.

The permanent magnet assembly 5 in the lateral detection mode image identification sensor shown in FIG. 6 includes a permanent magnet 5(9) and soft magnets 5(10) and 5(11). The soft magnets 5(10) and 5(11) are located on two ends of the permanent magnet 5(9), are symmetrically distributed at two sides of the front surface 1(2) of the PCB 1, and are parallel to the PCB 1, and the permanent magnet 5(9) is located at the bottom of the PCB 1. A gap formed between the soft magnets 5(10) and 5(11) is opened towards the magnetic image detection surface 3, and the magnetization direction of the permanent magnet 5(9) is perpendicular to the front surface 1(2) of the PCB 1.

Embodiment 3

FIGS. 7-10 are arrangement diagrams of the several magnetoresistive sensor chips 2 in the side mode image identification sensor on the PCB1.

Figure 7:
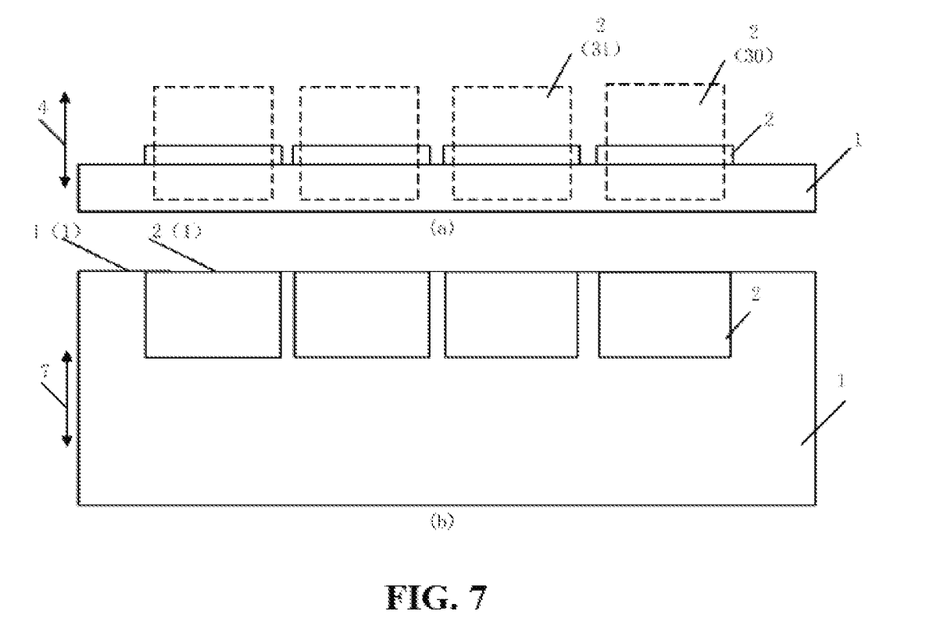
FIG. 7 is a spaced arrangement diagram of magnetoresistive magnetic sensor chips on a PCB in a lateral detection mode.

All the magnetoresistive sensor chips 2 in FIG. 7 are arranged into one row on the PCB 1, FIG. 7(a) is a side view, FIG. 7(b) is a front view, side faces 2(1) of the magnetoresistive sensor chips 2 are arranged sequentially along a side face 1(1) of the PCB 1, and there are gaps among them or the gaps are 0. Such an arrangement method has the following disadvantages: even if in the situation where the gaps are 0, in the presence of packaging materials, scanning detection areas 2(30) and 2(31) formed on the magnetic image detection surface 3 by adjacent magnetoresistive sensor chips 2 along the scanning direction 4 do not intersect with each other, and thus it is impossible to form continuous detection areas in the scanning direction; therefore, there are undetected areas in the detection of the magnetic image.

Figure 8:
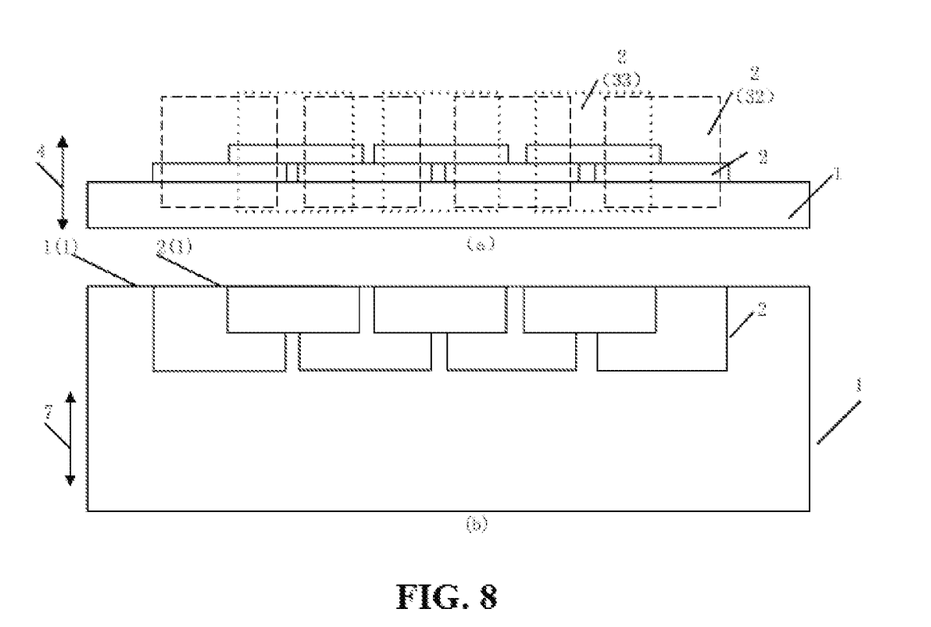
FIG. 8 is a first on-chip stacked arrangement diagram of the magnetoresistive magnetic sensor chips on the PCB in the lateral detection mode.
Figure 9:
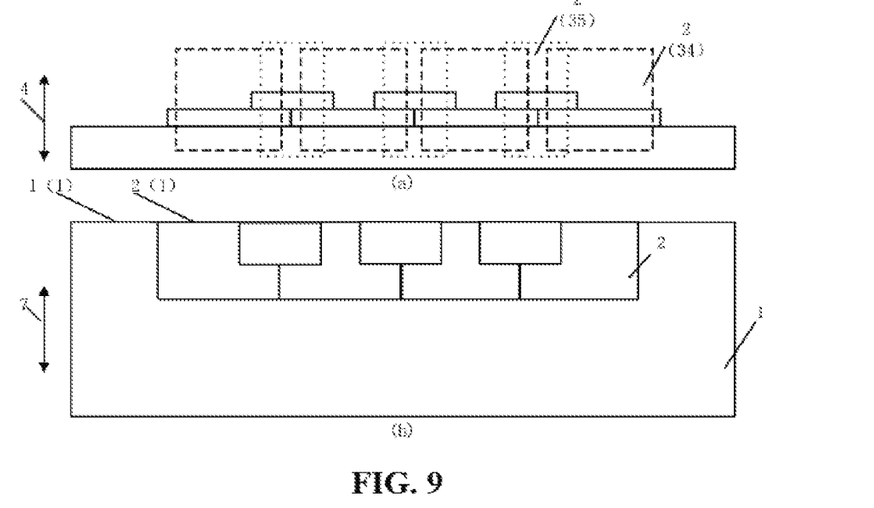
FIG. 9 is a second on-chip stacked arrangement diagram of the magnetoresistive magnetic sensor chips on the PCB in the lateral detection mode.
Figure 10:
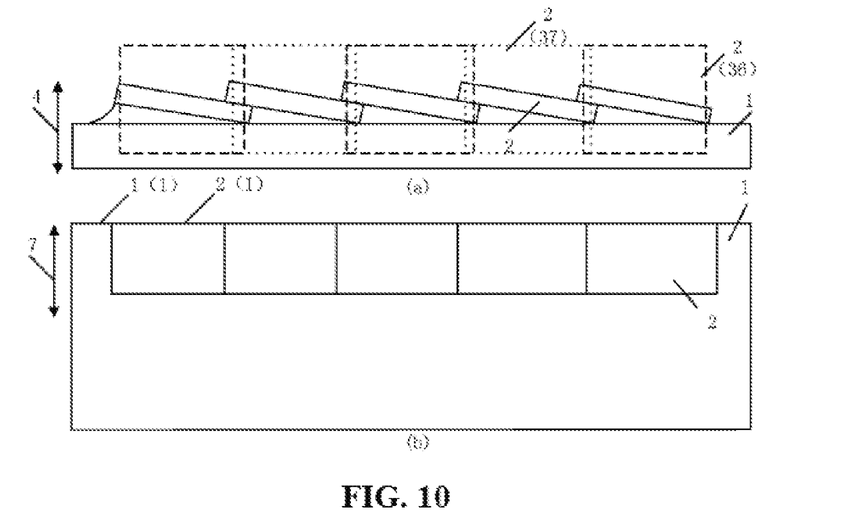
FIG. 10 is a third on-chip stacked arrangement diagram of the magnetoresistive magnetic sensor chips on the PCB in the lateral detection mode

In FIGS. 8-10, new arrangement methods of the magnetoresistive sensor chips 2 on the PCB 1 are provided with respect to the problem of the existence of undetected areas of the magnetic image in FIG. 7, that is, the magnetoresistive sensor chips 2 are arranged on the PCB 1 in a manner of enabling scanning detection areas formed on the magnetic image detection surface 3 by adjacent magnetoresistive sensor chips 2 along a scanning direction to be complementary to or intersect with each other; the arrangements are specifically as follows.

The first arrangement method of the magnetoresistive sensor chips 2 that can be employed is as follows: the adjacent magnetoresistive sensor chips 2 are on-chip staggered and stacked. As shown in FIG. 8 and FIG. 9, on the basis of sequential arrangement of the side faces 2(1) of a first layer of magnetoresistive sensor chips 2 along the side face 1(1) of the PCB 1, as shown in FIG. 7, a second layer of magnetoresistive sensor chips 2 are added, which are located on the first layer of magnetoresistive sensor chips 2, and each magnetoresistive sensor chip 2 is located in an area between two adjacent magnetoresistive sensor chips 2 in the first layer, so as to form a staggered and stacked structure, such that scanning detection areas 2(32) and 2(33) formed by the two adjacent magnetoresistive sensor chips 2 in the scanning direction 4 are areas complementary to or overlapping with each other, thus ensuring that there is no undetected area in the detection of the magnetic image during scanning.

The second arrangement method of the magnetoresistive sensor chips 2 that can be employed is as follows: the adjacent magnetoresistive sensor chips 2 are obliquely on-chip stacked. In FIG. 10, one side of each magnetoresistive sensor chip 2 is cocked away from the front surface 1(1) of the PCB 1, while the other side is on the PCB 1, that is, each magnetoresistive sensor chip 2 is disposed obliquely, such that, in the adjacent magnetoresistive sensor chips 2, a non-cocked side of one magnetoresistive sensor chip 2 is obliquely stacked with a cocked side of the other magnetoresistive sensor chip 2 at an edge, thus ensuring that scanning detection areas 2(34) and 2(35) formed by the adjacent magnetoresistive sensor chips 2 in the scanning direction 4 have overlapping areas and guaranteeing that there is no undetected area in the detection of the magnetic image during scanning.

Embodiment 4

Figure 11:
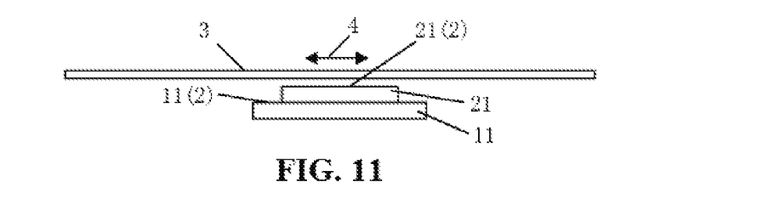
FIG. 11 is a diagram of a front detection mode image identification sensor.

FIG. 11 shows a structure of a front detect mode image identification sensor, including a PCB 11 and several magnetoresistive sensor chips 21, wherein the several magnetoresistive sensor chips 21 are located on a front surface 11(2) of the PCB 11, and front surfaces 21(2) thereof are parallel to a magnetic image detection surface 3. If the front detect mode image identification sensor is applied to detection of a hard magnet, the magnetic sensing direction thereof may be parallel or perpendicular to the magnetic image detection surface 3, and when the magnetic sensing direction is parallel to the magnetic image detection surface 3, the direction may be parallel or perpendicular to a scanning direction 4. When a magnetic image is formed by a hard magnet, a magnetic field generated by the hard magnet will act on the magnetoresistive sensor chips 21 and convert their magnetic field distribution features along the scanning direction 4 to electric signals, thus achieving reading of the magnetic image.

Embodiment 5

Figure 12:
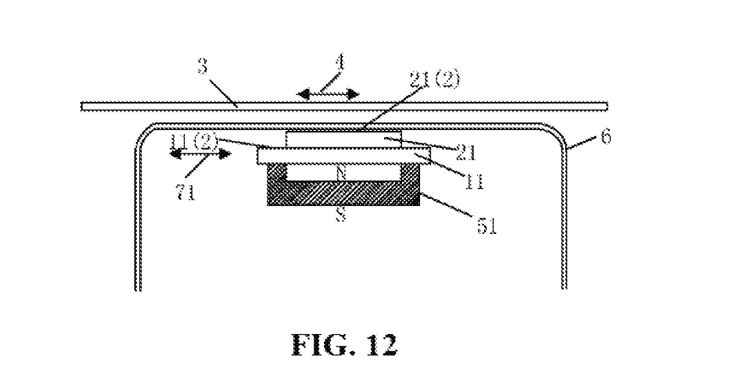
FIG. 12 is a schematic diagram of a first permanent magnet assembly used in the front detection mode image identification sensor.
Figure 13:
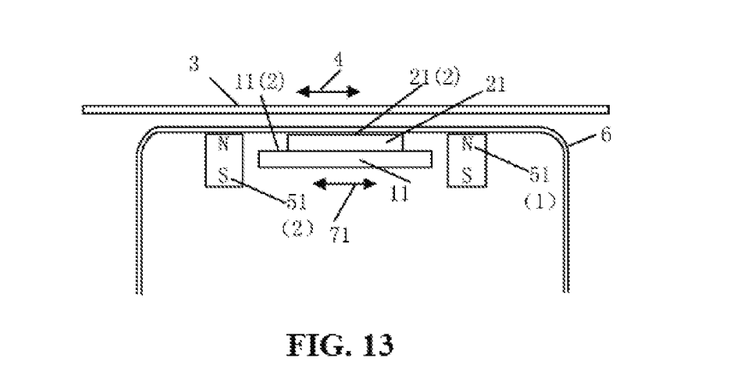
FIG. 13 is a schematic diagram of a second permanent magnet assembly used in the front detection mode image identification sensor.
Figure 14:
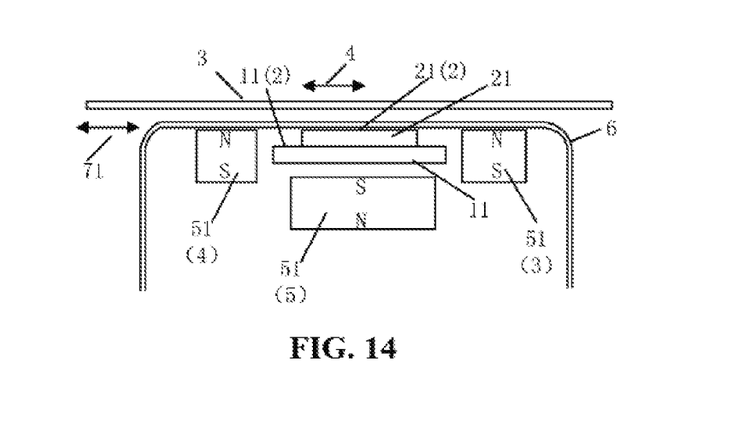
FIG. 14 is a schematic diagram of a third permanent magnet assembly used in the front detection mode image identification sensor.

FIGS. 12-14 show application of the front detection mode image identification sensor in detection of a magnetic image made of a soft magnetic material.

The front detection mode image identification sensor shown in FIGS. 12-14 further includes a permanent magnet assembly 51 and a housing 6. The PCB 11 and the several magnetoresistive sensor chips 21 are located in the housing 6, and the permanent magnet assembly 51 may be located in the housing 6 and may also be partially or wholly located outside the housing 6; the latter may be conducive to reduction of the size of the image identification sensor. In the presence of the permanent magnet assembly 51, magnetic sensing directions 71 of the magnetoresistive sensor chips 21 are identical with the scanning direction 4 and parallel to the magnetic image detection surface 3.

The permanent magnet assembly 51 in the front detection mode image identification sensor shown in FIG. 12 is a concave permanent magnet, of which the geometrical structure is a rectangular groove provided on an upper surface of a block. On the PCB 11 of the front detection mode image identification sensor, a surface having a greater area and opposite to the front surface 11(2) is its back surface. An upper surface of the concave permanent magnet directly faces the back surface of the PCB 11 and is directly in contact with the back surface of the PCB 11, the magnetization direction of the concave permanent magnet is perpendicular to the front surface 11(2) of the PCB 11, and the penetration direction of the rectangular groove, that is, the grooving direction, is perpendicular to the scanning direction 4 and parallel to the magnetic image detection surface 3.

The permanent magnet assembly 51 in the front detection mode image identification sensor shown in FIG. 13 includes two permanent magnets 51(1) and 51(2) which are symmetrically located on two sides of the magnetoresistive sensor chips 21 along the scanning direction 4 respectively, wherein magnetization directions thereof are perpendicular to the magnetic image detection surface 3 and the front surface 11(2) of the PCB 11, and the magnetization directions are the same.

The permanent magnet assembly 51 in the front detection mode image identification sensor shown in FIG. 14 includes three permanent magnets 51(3), 51(4) and 51(5), wherein two permanent magnets 51(3) and 51(4) are symmetrically distributed on two sides of the magnetoresistive sensor chips 21 along the scanning direction 4, which are referred to as side permanent magnets, and their magnetization directions are the same and are perpendicular to the magnetic image detection surface 3; another permanent magnet 51(5) is located directly below the PCB 11, that is, the back surface, which is referred to as a back permanent magnet, and its magnetization direction is reverse-parallel to the permanent magnets 51(3) and 51(4).

Embodiment 6

Figure 15:
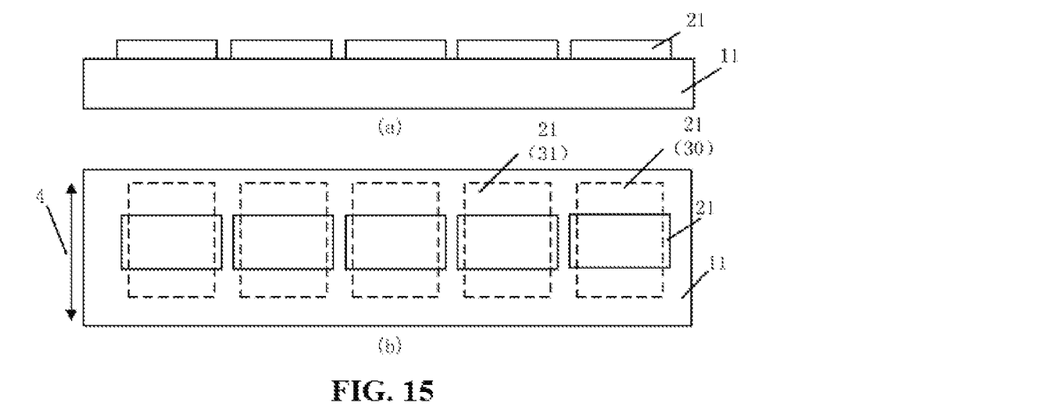
FIG. 15 is a spaced arrangement diagram of magnetoresistive magnetic sensor chips on a PCB in a front detection mode.
Figure 16:
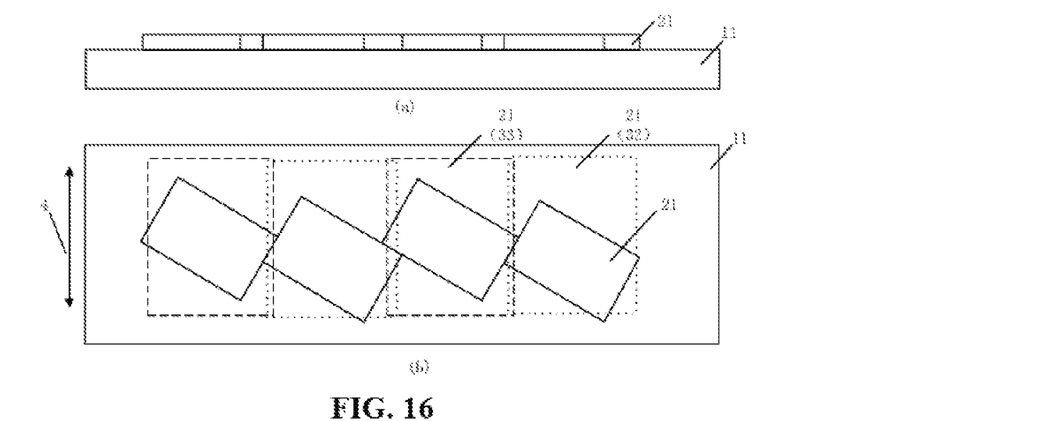
FIG. 16 is a first staggered arrangement diagram of magnetoresistive sensor chips on a substrate in the front detection mode.
Figure 17:
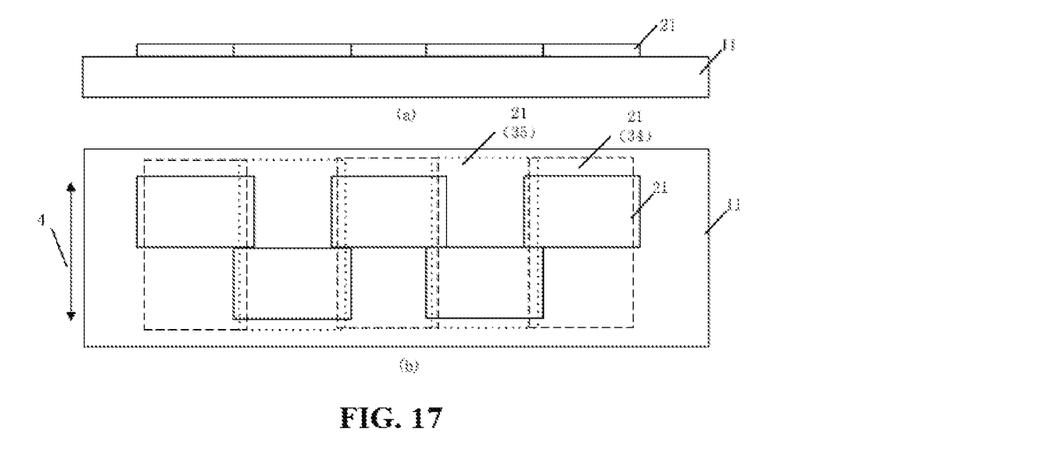
FIG. 17 is a second staggered arrangement diagram of the magnetoresistive sensor chips on the substrate in the front detection mode.

FIGS. 15-17 are arrangement diagrams of several magnetoresistive sensor chips 21 of the front detection mode image identification sensor on the PCB 11.

FIGS. 15(a) and 15(b) are a side view and a front view respectively, in which the magnetoresistive sensor chips 21 are arranged into one row on the PCB 11, and the direction of the row is perpendicular to the scanning direction 4 or the magnetic sensing directions 71. In the presence of the packaging material in the magnetoresistive sensor chips 21, even if the gap between the adjacent magnetoresistive sensor chips 21 is 0, scanning detection areas 21(30) and 21(31) formed on the magnetic image detection surface 3 by the adjacent magnetoresistive sensor chips 21 along the scanning direction 4 do not intersect with each other, and thus there are undetected areas on the magnetic image detection surface 3.

In order to make up for the problem of undetected areas, FIG. 16 and FIG. 17 improve the arrangement method of the magnetoresistive sensor chips 21 on the PCB 11.

An arrangement method of the magnetoresistive sensor chips 21 that can be employed is as follows: on the front surface 11(2) of the PCB 11, the adjacent magnetoresistive sensor chips 21 are arranged in a manner that edges are mutually staggered. FIGS. 16(a) and 16(b) are a side view and a front view of one arrangement method respectively, the scanning direction 4 and the magnetic sensing directions 71 of the magnetoresistive sensor chips 21 are the same, the magnetoresistive sensor chips 21 are disposed obliquely on the front surface 11(2) of the PCB 11, the adjacent magnetoresistive sensor chips 21 are arranged in a staggered manner, and edges of the magnetoresistive sensor chips 21 are mutually staggered, such that scanning detection areas 21(32) and 21(33) formed on the magnetic image detection surface 3 by the adjacent magnetoresistive sensor chips 21 along the scanning direction 4 can overlap with each other, which solves the problem of missed detection.

FIGS. 17(a) and 17(b) are a side view and a front view of another arrangement method respectively, a third magnetoresistive sensor chip 21 is inserted in a middle position of the row direction of two adjacent magnetoresistive sensor chips 21 and overlaps with the two adjacent magnetoresistive sensor chips 21 at edges, such that scanning detection areas 21(34) and 21(35) of the adjacent magnetoresistive sensor chips 21 overlap with each other, thereby solving the problem of missed detection.

Figure 18:
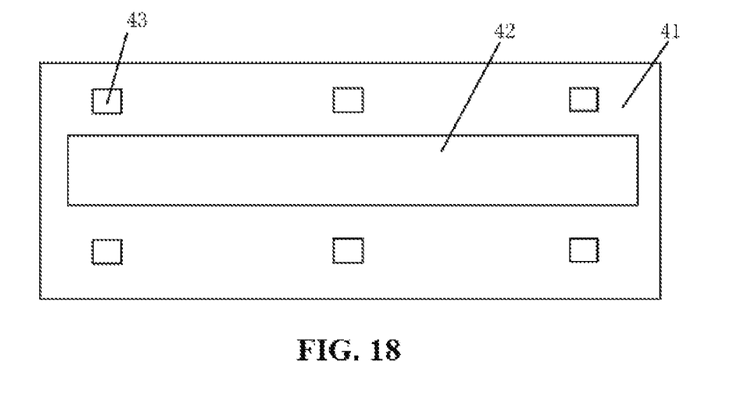
FIG. 18 is a front view of a slice of a magnetoresistive sensor chip.
Figure 19:
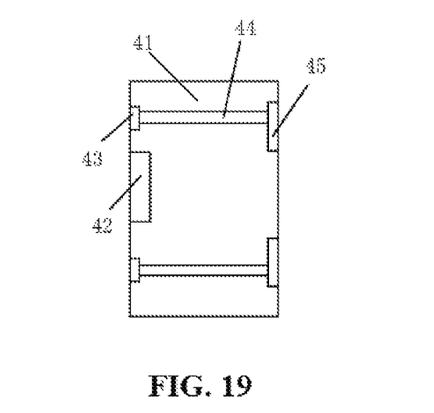
FIG. 19 is a side view of a slice of the magnetoresistive sensor chip.
Figure 20:
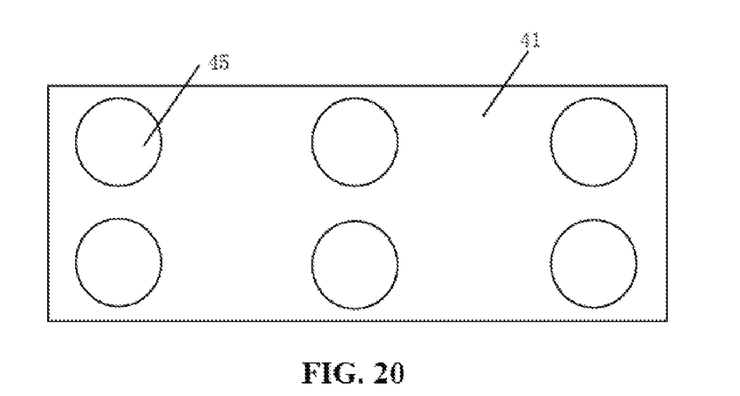
FIG. 20 is a back view of a slice of the magnetoresistive sensor chip.

FIGS. 18-20 are a front view, a side view and a back view of wafer slices of the magnetoresistive sensor chips in the above embodiments. It can be seen that the magnetoresistive sensor chips each include a magnetic sensing unit 42, the magnetoresistive sensing unit 42 is in the front surface of a Si slice 41, and a signal and power pin 43 may be located in the front surface of the Si slice 41 and is led out through wirebonding; a pin 45 may also be formed on the back surface of the Si slice 41 by passing through the Si slice 41 via a TSV via 44. That is, the magnetoresistive sensor chips are of a packaging structure adopting a front bonding pad or a TSV via a back bonding pad of the magnetoresistive sensor chips for wirebonding. The connection between upper and lower layers of magnetoresistive sensor chips 2 in FIG. 9 may be implemented by connecting onto the PCB 1 through wirebonding, or by direct connection via a pin between the front surface and the back surface. In the front detection mode image identification sensor, employing a TSV back pin, compared with the front wirebonding, can reduce a detection distance between the magnetoresistive sensor 21 and the magnetic image detection surface 3 and increase magnetic field intensity.

Figure 21:
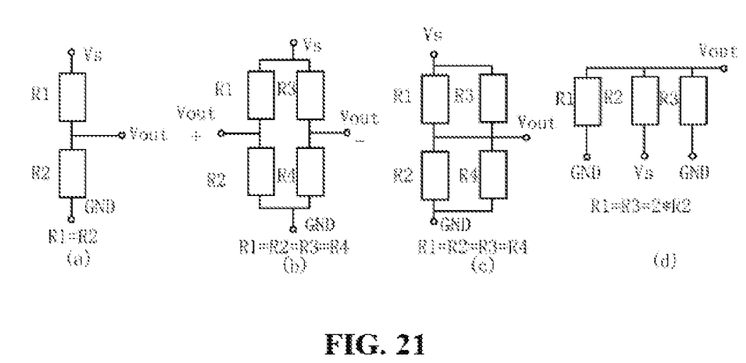
FIG. 21 is a schematic structural diagram of a magnetoresistive magnetic sensor: a) a half-bridge structure; b) a full-bridge structure; c) a double half-bridge structure; and d) a three-element half-bridge structure.

FIG. 21 is a composition structure diagram of the magnetic sensing unit 42 in the magnetoresistive sensor chip 2 or 21, and FIG. 21(a) shows a half-bridge structure including two sensing units R1 and R2. The two sensing units R1 and R2 are arranged into two rows and one column, and the two magnetic sensing units R1 and R2 have the same resistance and directly form a half bridge. FIG. 21(b) shows a full-bridge structure including four sensing units R1, R2, R3 and R4 and having two outputs Vout+ and Vout−. The four magnetic sensing units R1, R2, R3 and R4 are arranged into two rows and two columns. Two sensing units included in two half bridges forming a full bridge are located in two rows but in different columns respectively. In the lateral detection mode image identification sensor, the column direction thereof is perpendicular to the magnetic image detection surface 3, and during packaging, the sensing units are located on one side of the chips close to the magnetic image detection surface 3. In the front detection mode image identification sensor, the column direction thereof is parallel to the scanning direction 4. FIG. 21(c) shows a half-bridge structure including four sensing units R1, R2, R3 and R4 arranged into two rows and two columns, two magnetic sensing units in the same row are connected in parallel, and then the two rows are connected in series to form a half-bridge structure; two half bridges R1, R2 and R3, R4 share a power source respectively and are grounded, but have a common output end. FIG. 21(d) shows a three-sensing-element half-bridge structure arranged into three rows and one column, including three sensing units R1, R2 and R3, wherein two sensing units R1 and R3 located in two side rows have the same resistance, and the resistance is twice that of the sensing unit R2 in the middle row, the sensing units R1 and R3 are connected in parallel and then connected in series with R2 to form a half bridge, and output signal voltages are output from a common end in the middle of R1, R2 and R3. The magnetoresistive sensing units may be one of TMR, Hall, AMR or GMR unit. Magnetic sensing directions of various magnetic sensing units are the same.

Figure 22:
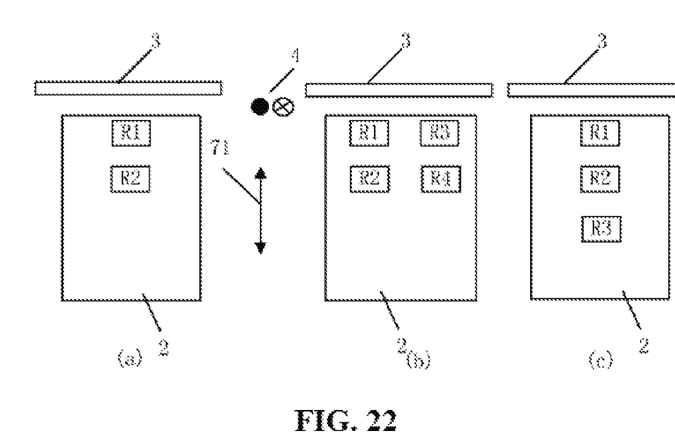
FIG. 22 is an arrangement diagram of sensing units on a magnetoresistive sensor chip in a lateral detection mode: a) a half-bridge structure; b) a full-bridge or double half-bridge structure; and c) a three-element half-bridge structure.

FIG. 22 is an arrangement diagram of sensing units in the magnetoresistive sensor chips 2 of the lateral detection mode image identification sensor.

FIG. 22(a) shows a half-bridge structure, wherein sensing units R1 and R2 form an arrangement of two rows and one column, R1 is located in one row close to the magnetic image detection surface 3 and parallel to the magnetic image detection surface 3, R2 is located in the other row, their magnetic sensing directions are the same and are both in directions 71, the column direction is perpendicular to the magnetic image detection surface 3, and 4 is a scanning direction.

FIG. 22(b) shows a full-bridge structure or two half-bridge structures, wherein sensing units R1-R4 are arranged into two rows and two columns, wherein R1 and R3 are located in one row close to the magnetic image detection surface 3, R2 and R4 are located in the other row, R1 and R2 form a half bridge, and R3 and R4 form a half bridge.

FIG. 22(c) shows a three-resistor half-bridge structure including three sensing units R1, R2 and R3 arranged into a structure of three rows and one column, wherein R1 is located in one row close to the magnetic image detection surface 3, R2 is located between R1 and R3, and magnetic sensing directions of R1, R2 and R3 are directions 71 and perpendicular to the magnetic image detection surface 3, and 4 is a scanning direction.

In the TMR magnetic sensor chip 2 or 21 corresponding to FIG. 22, during packaging, the sensing units R1, R2, R1-R4 or R1-R3 are located on one side close to the magnetic image detection surface 3.

Figure 23:
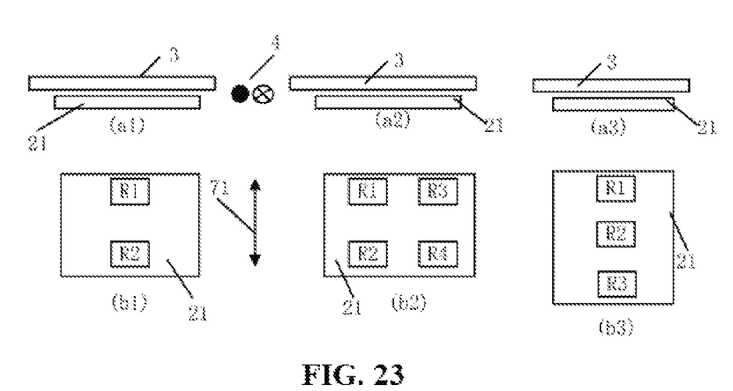
FIG. 23 is an arrangement diagram of sensing units on a magnetoresistive sensor chip in a front detection mode: a) a half-bridge structure; b) a full-bridge or double half-bridge structure; and c) a three-element half-bridge structure.

FIG. 23 is an arrangement diagram of sensing units in the magnetoresistive sensor chips 21 of the front detection mode image identification sensor, wherein FIGS. 23(a1), 23(a2) and 23(a3) are side views, FIGS. 23(b1), 23(b2) and 23(b3) are front views of the chips 21, and the scanning direction is 4. FIG. 23(b1) shows a half-bridge structure including two sensing units R1 and R2, and their arrangement directions are parallel to the sensing directions 71 and identical to the scanning direction 4. FIG. 23(b2) shows a full-bridge structure, R1 and R2 are corresponding to one bridge arm therein, R3 and R4 are corresponding to the other bridge arm, and R1, R2 and R3, R4 are arranged along the sensing directions 71. FIG. 23(b3) shows a three-element half-bridge structure, the sensing units R1, R2 and R3 are arranged into rows along the scanning direction 4, R2 is located between R1 and R3, and magnetic sensing directions of R1-R3 are 71. The contour of the chips 21 in FIG. 23 is a parallel arrangement structure relative to the sensing units, and when the chips are obliquely superposed and arranged, the shape of the chips may rotate by a certain angle relative to arrangement of the sensing units.

It should be noted that the magnetoresistive sensor chips of the full-bridge structure or half-bridge structure may be a single magnetoresistive sensor chip integrated with several sensing units, and may also be replaced with discrete elements of several magnetoresistive sensor chips. For the latter, discrete magnetoresistive sensor chips are integrated with one or more sensing units, and the discrete magnetoresistive sensor chips form a half-bridge or full-bridge structure through interconnection.

In addition, when an image formed by a hard magnet is detected in FIG. 23, magnetic sensing directions of the sensing units of the magnetoresistive sensor 21 may be parallel or perpendicular to the magnetic image detection surface 3, and when the magnetic sensing directions are parallel to the magnetic image detection surface 3, the direction thereof may be parallel to or perpendicular to the scanning direction 4.

The invention claimed is:

1. A magnetoresistive magnetic imaging sensor for identifying a magnetic image located at a magnetic image detection surface, the magnetoresistive magnetic imaging sensor comprising several magnetoresistive sensor chips on a printed circuit board (PCB) and a permanent magnet assembly, the several magnetoresistive sensor chips including adjacent magnetoresistive sensor chips, wherein the magnetoresistive magnetic imaging sensor is either:
  a lateral detection mode image identification sensor where each side face of the several magnetoresistive sensor chips is parallel to the magnetic image detection surface, wherein magnetic sensing directions of the several magnetoresistive sensor chips of the lateral detection mode image identification sensor are perpendicular to the magnetic image detection surface, or
  a front detection mode image identification sensor where front surfaces of the several magnetoresistive sensor chips of the front detection mode image identification sensor are parallel to the magnetic image detection surface, wherein magnetic sensing directions of the several magnetoresistive sensor chips of the front detection mode image identification sensor are parallel to the scanning direction
  wherein the adjacent magnetoresistive sensor chips overlap in scanning detection areas along a scanning direction on the magnetic image detection surface,
  wherein, for the lateral detection mode image identification sensor, the permanent magnet assembly comprises a structure having an opening towards the magnetic image detection surface and formed by a permanent magnet and an L-shaped soft magnet, which are located on the same side of the PCB, and the L-shaped soft magnet is located between the permanent magnet and the PCB, the permanent magnet is located on the bottom of the L-shaped soft magnet and the magnetization direction thereof is perpendicular to the magnetic image detection surface, and a side face of the L-shaped soft magnet is parallel to the PCB.

2. The magnetoresistive magnetic imaging sensor for identifying a magnetic image according to claim 1, wherein the magnetoresistive sensor chips are a half-bridge structure comprising two, three or four magnetic sensing units arranged into two rows and one column, three rows and one column, or two rows and two columns respectively, and magnetic sensing directions of the various magnetic sensing units are identical;

when the magnetoresistive magnetic sensor chips comprise two magnetic sensing units, the two magnetic sensing units have the same resistance and directly form a half bridge;

when the magnetoresistive magnetic sensor chips comprise three magnetic sensing units, the resistance of the sensing unit in the middle row is half of the resistances of the two sensing units on two side rows, and the two sensing units on the two side rows, after being connected in parallel, form a half-bridge structure with the sensing unit in the middle row;

when the magnetoresistive magnetic sensor chips comprise four magnetic sensing units, resistances of the four sensing units are the same, and two magnetic sensing units in the same row are connected in parallel and then the two rows are connected in series to form a half-bridge structure;

in the lateral detection mode image identification sensor, the column direction thereof is perpendicular to the magnetic image detection surface, and during packaging, the magnetic sensing units are located on one side of the chips close to the magnetic image detection surface; and in the front detection mode image identification sensor, the column direction thereof is parallel to the scanning direction.

3. The magnetoresistive magnetic imaging sensor for identifying a magnetic image according to claim 1, wherein the magnetoresistive sensor chips are a full-bridge structure comprising four magnetic sensing units, and magnetic sensing directions of the various magnetic sensing units are identical, the four magnetic sensing units are arranged into two rows and two columns, two sensing units comprised in two half bridges forming a full bridge are located in two rows but in different columns respectively; in the lateral detection mode image identification sensor, the column direction thereof is perpendicular to the magnetic image detection surface, and during packaging, the sensing units are located on one side of the chips close to the magnetic image detection surface, and in the front detection mode image identification sensor, the column direction thereof is parallel to the scanning direction.

4. The magnetoresistive magnetic imaging sensor for identifying a magnetic image according to claim 2, wherein the magnetoresistive sensor chips of the half-bridge structure are a single magnetoresistive sensor chip integrated with several sensing units, or an interconnected combination of discrete elements of several magnetoresistive sensor chips integrated with one or more sensing units.

5. The magnetoresistive magnetic imaging sensor for identifying a magnetic image according to claim 3, wherein the magnetoresistive sensor chips of the full-bridge structure are a single magnetoresistive sensor chip integrated with several sensing units, or an interconnected combination of discrete elements of several magnetoresistive sensor chips integrated with one or more sensing units.

6. The magnetoresistive magnetic imaging sensor for identifying a magnetic image according to claim 1, wherein the magnetoresistive sensor chips are of a packaging structure adopting a front bonding pad or a TSV via a back bonding pad of the magnetoresistive sensor chips for wire-bonding.

7. The magnetoresistive magnetic imaging sensor for identifying a magnetic image according to claim 1, further comprising a housing in which the PCB and the several magnetoresistive sensor chips are placed; the permanent magnet assembly being partially or wholly placed in the housing, or wholly located outside the housing.

8. The magnetoresistive magnetic imaging sensor for identifying a magnetic image according to claim 1, wherein the magnetic sensing units in the magnetoresistive magnetic sensor chips are one of AMR, Hall, GMR or TMR type magnetoresistive sensor.

9. The magnetoresistive magnetic imaging sensor for identifying a magnetic image according to claim 1, wherein each side face of the magnetoresistive sensor chips corresponding to the lateral detection mode image identification sensor is coplanar with a side face of the PCB or parallel to the magnetic image detection surface.

* * * * *